(12) United States Patent  
Deevi et al.

(10) Patent No.: US 6,368,406 B1
(45) Date of Patent: Apr. 9, 2002

(54) NANOCRYSTALLINE INTERMETALLIC POWDERS MADE BY LASER EVAPORATION

(75) Inventors: Seetharama C. Deevi, Midlothian; Yezdi B. Pithawalla; M. S. El Shall, both of Richmond, all of VA (US)

(73) Assignee: Chrysalis Technologies Incorporated, Richmond, VA (US)

( * ) Notice: Subject to any disclaimer, the term of this patent is extended or adjusted under 35 U.S.C. 154(b) by 0 days.

(21) Appl. No.: 09/660,962

(22) Filed: Sep. 13, 2000

(51) Int. Cl.$^7$ .............................................. C30B 25/04
(52) U.S. Cl. ......................................... 117/108; 117/84
(58) Field of Search ................... 117/84, 108

(56) References Cited

U.S. PATENT DOCUMENTS

| | | |
|---|---|---|
| 4,705,762 A | 11/1987 | Ota et al. |
| 5,562,771 A | 10/1996 | Kawaguchi et al. |
| 5,580,655 A | 12/1996 | El-Shall et al. |
| 5,597,558 A | 1/1997 | Aubert et al. |
| 5,618,475 A * | 4/1997 | Johnson et al. ............ 264/10 |
| 5,665,277 A | 9/1997 | Johnson et al. |
| 5,695,617 A | 12/1997 | Gravier et al. |
| 5,728,195 A | 3/1998 | Eastman et al. |
| 5,770,022 A | 6/1998 | Chang et al. |
| 5,851,507 A | 12/1998 | Pirzada et al. |
| 5,879,715 A | 3/1999 | Higgins et al. |
| 5,891,548 A | 4/1999 | Gravier et al. |
| 5,958,329 A | 9/1999 | Brown |
| 5,962,132 A | 10/1999 | Change et al. |
| 6,080,337 A | 6/2000 | Kambe et al. |

OTHER PUBLICATIONS

Haber, "Nanostructure by Design: Solution–phase–processing Routes to Nanocrystalline Metals, Ceramics, Intermetallics, and Composites", J. Aerosol Sci. (1998), pp. 637–645.

Jartych E., et al., "Hyperfine Interactions in Nanocrystalline Fe–Al Alloys", J. Phys, Condens. Matter, 10:4929 (1998), pp. 4929–4936.

Perez R.J., et al., "Thermal Stability of Nanocrystalline Fe–10 wt. % Al Produced by Cryogenic Mechanical Alloying", Nanostructured Materials, 7:565 (1996), pp. 565–572.

Jartych, E. et al., "Magnetic Properties and Structure of Nanocrystalline Fe–Al and Fe–Ni Alloys", NanoStructured Materials, vol. 12, pp. 937–930, 1999.

Amilis, X. et al., "Microstructure and Hardness of a Nanostructured Fe–40Al at% Alloy", NanoStructured Materials, vol. 12, pp. 801–806, 1999.

Notification of Transmittal of the International Search Report or the Declaration (no mailing date–recieved Jan. 7, 2002) for PCT/US01/42002, International Filing Date: Sep. 6, 2001.

* cited by examiner

Primary Examiner—Felisa Hiteshew
(74) Attorney, Agent, or Firm—Burns, Doane, Swecker & Mathis, LLP

(57) ABSTRACT

A method of making intermetallic nanoparticles comprising subjecting a starting material to laser energy so as to form a vapor and condensing the vapor so as to form intermetallic nanoparticles. The starting material can be a mixture of pure elements or an alloy of two or more elements. The nanoparticles can be provided with a narrow size distribution with an average particle size of 2 to 100 nm, preferably 2 to 50 nm and more preferably 2 to 9 nm. The nanoparticles can be formed in a vacuum chamber wherein a temperature gradient is provided. The atmosphere in the chamber can be an inert atmosphere such as argon or a reactive atmosphere such as isobutene or oxygen. An electric field can be used to form filaments of the nanoparticles.

21 Claims, 13 Drawing Sheets

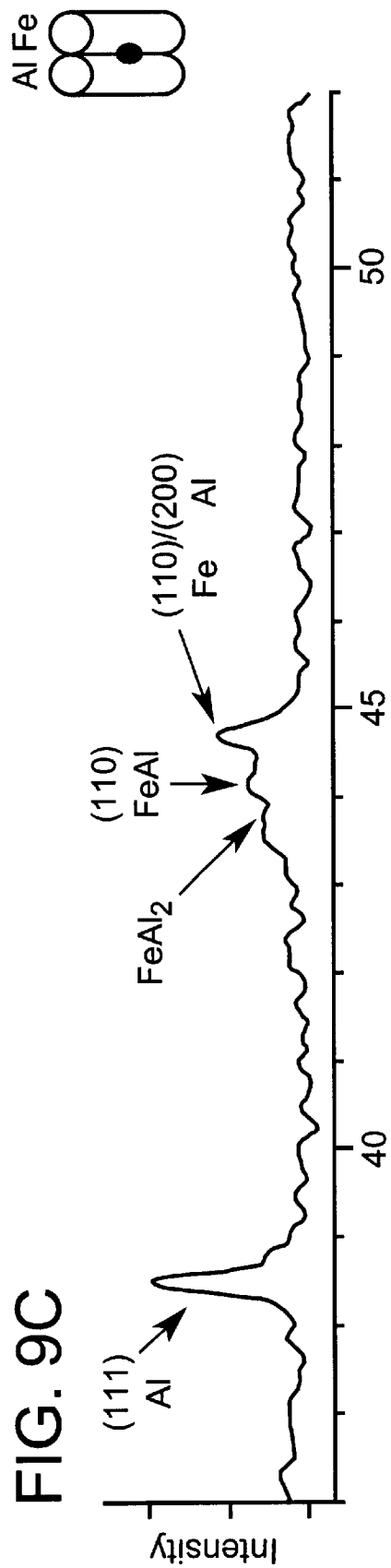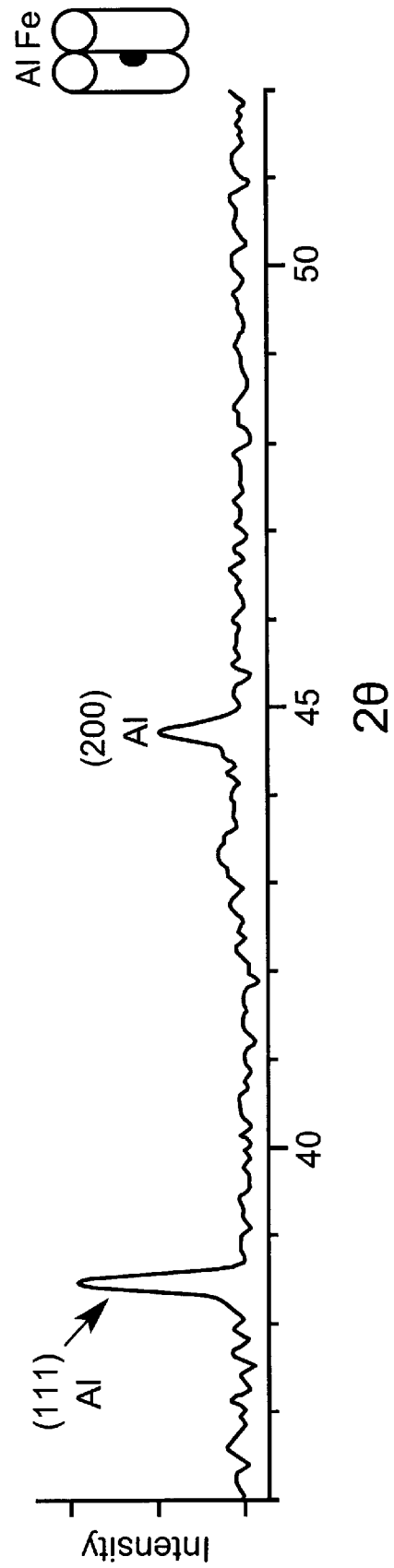

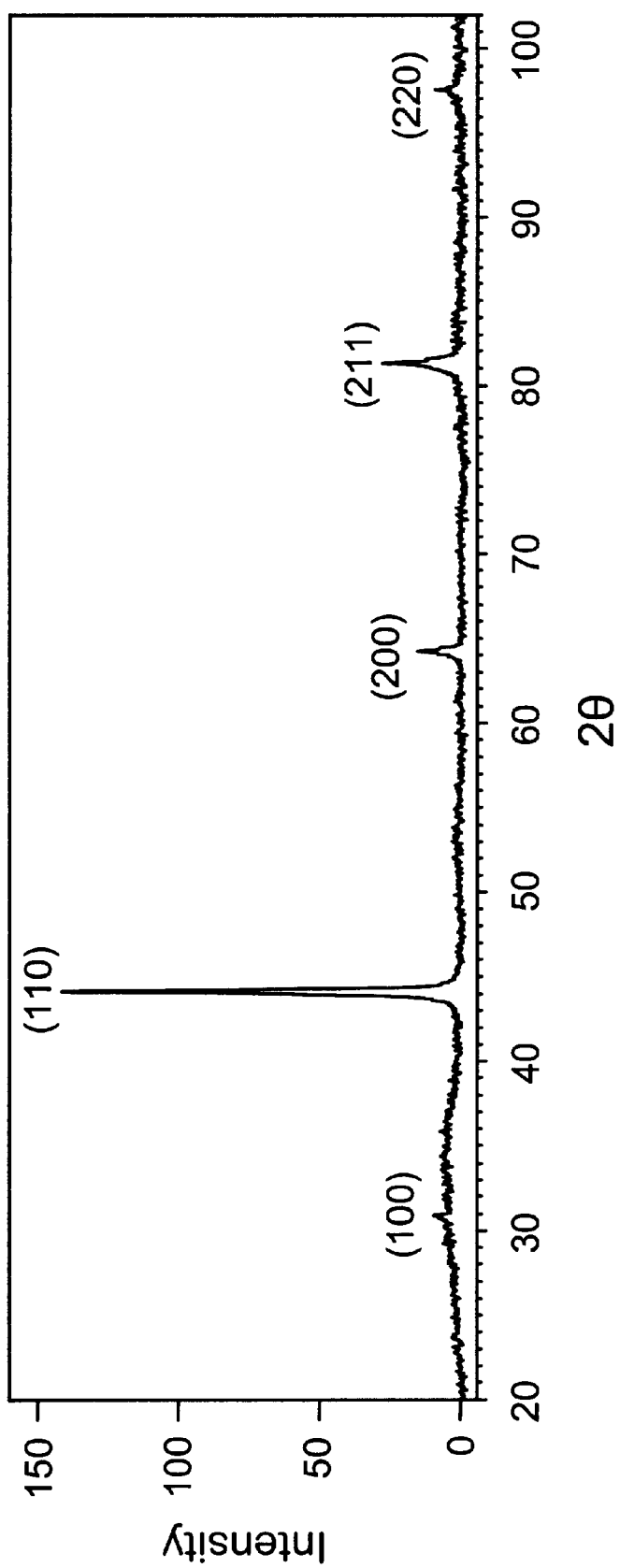

NANOCRYSTALLINE INTERMETALLIC POWDERS MADE BY LASER EVAPORATION

FIELD OF THE INVENTION

The invention relates to methods of making nanocrystalline powder such as intermetallic powders.

BACKGROUND

Nanoparticles have been reportedly made from metals (e.g., Pd, Cu, intermetallics (e.g., $Al_{52}Ti_{48}$)), semiconductors such as Si, metal carbonates such as $ZnCO_3$, and metal oxides (e.g., $SiO_2$, $TiO_2$, $Y_2O_3$, ZnO, MgO, $Al_2O_3$). See, for example, U.S. Pat. Nos. 5,580,655; 5,695,617; 5,770,022; 5,879,715; 5,891,548 and 5,962,132, the disclosures of which are hereby incorporated by reference. Previously, the production of nanoparticles has been reported by methods such as chemical synthesis, gas-phase synthesis, condensed phase synthesis, high speed deposition by ionized cluster beams, consolidation, high speed milling, deposition and sol-gel methods. These methods suffer from numerous drawbacks, including agglomeration, broad particle size distribution, or low volume production.

The most common method reported in the literature for the synthesis of intermetallic nanoparticles is mechanical ball milling. (Jartych E., et al., *J. Phys. Condens. Matter*, 10:4929 (1998); Jartych E., et al., *Nanostructured Materials*, 12:927 (1999); Amilis, X., et al., *Nanostructured Materials* 12:801 (1999); Perez R. J., et al., *Nanostructured Materials*, 7:565 (1996)). Jartych et al. report preparation of nanocrystalline powders of Fe-30 at. % Al, Fe-40 at. % Al and Fe-50 at. % Al by ball milling, all of which were found to possess strong ferromagnetic interactions. (Jartych E., et al., *J. Phys. Condens. Matter*, 10:4929 (1998); Jartych E., et al., *Nanostructured Materials*, 12:927 (1999)). However, the authors reported that even after 800 hours of milling time, small quantities of α-Fe were still present in the samples as indicated by the hyperfine magnetic field distribution measurements. The presence of α-Fe is believed to produce defects and high strain levels within the nanoparticles. Amilis and coworkers reported that the microhardness of nanoscale Fe-40Al at % alloy directly correlated with defect concentration. (Amilis, X., et al., *Nanostructured Materials* 12:801 (1999)). They reported possible media contamination during the process of ball milling, which resulted in the presence of low concentrations of $SiO_2$ from the agate used for milling and presence of $Fe_3Al$. Perez and coworkers reportedly synthesized nanoparticles of Fe-10 at. % Al using cryogenic milling at liquid nitrogen temperature. (Perez, R. J., et al., *Nanostructured Materials*, 7:565 (1996)). The thermal stability of these particles was found to be significantly higher than that of Fe nanoparticles produced under analogous conditions. The authors speculated that this increase in stability might be due to the formation of fine dispersoids of γ-$Al_2O_3$ or AlN, which would restrict the movement of the grain boundaries. In spite of the simplicity and efficiency of ball milling as a means by which nanoparticles of metallic alloys may be synthesized, there are some problems and limitations. For example, the microstructure of the milling products is very sensitive to the grinding conditions and may be unpredictably affected by unwanted contamination from the milling media and atmosphere. In addition, excessively long periods of milling time may be required to obtain particles smaller than 20 mn. (Amilis, X., et al., *Nanostructured Materials* 12:801 (1999); Perez R. J., et al., *Nanostructured Materials*, 7:565 (1996)).

In view of the state of the art, new methods of making intermetallic nanoparticles would therefore be desirable.

The present invention provides a simple and novel approach for synthesizing intermetallic nanoparticles using laser vaporization coupled with condensation from the vapor phase. The laser vaporization techniques provide several advantages over heating methods restricted by the temperature of the crucible. Among these advantages are the production of a high density vapor of any metal, the generation of a directional high-speed metal vapor from the solid target which can be useful for directional deposition of the particles, and the simultaneous or sequential evaporation of several different targets.

SUMMARY OF THE INVENTION

In one respect, the present invention provides a method of making intermetallic nanoparticles. The method comprises subjecting a starting material to laser energy so as to form a vapor and condensing the vapor so as to form intermetallic nanoparticles.

In one embodiment, the invention provides a method of producing intermetallic nanoparticles which employs laser vaporization with controlled condensation. This method allows control over the size, shape, and surface morphology of the nanoparticles that are produced.

Precise control of shape, size and surface morphology of materials at the nano scale level should serve as the underlying basis for building new high performance innovative materials that possess novel electronic, optical, magnetic, photochemical and catalytic properties. Such materials are essential for technological advances in photonics, quantum electronics, catalysis, nonlinear optics and information storage and processing.

BRIEF DESCRIPTION OF THE DRAWINGS

FIGS. 10a–c show effects of forming FeAl nanoparticles in absence of an electric field wherein FIG. 10a shows a SEM image of the as-deposited FeAl nanoparticles on a glass substrate, FIG. 10b shows a TEM image and Electron Diffraction of FeAl nanoparticles, and FIG. 10c shows an X-ray diffraction of FeAl nanoparticles;

FIG. 11b shows FeAl tree-like aggregates formed at later time after the generation of more nanoparticles under the influence of 60 V/cm field, FIG. 11c shows a rotation of the FeAl branches under the influence of 80 V/cm field, and FIG. 11d shows a SEM image of the as-deposited FeAl filaments formed under the influence of 30 V/cm field.

DETAILED DESCRIPTION OF THE INVENTION

The present invention relates to a method of making intermetallic nanoparticles comprising subjecting a starting material to laser energy so as to form a vapor and condensing the vapor so as to form intermetallic nanoparticles.

The starting material used in the method of the invention may be any suitable precursor material with a preferred form being solid or powder materials composed of pure materials or a mixture of materials. Such materials are preferably solids at room temperature and/or not susceptible to chemical degradation during the practice of the invention.

In the method of the invention, the starting material is exposed to pulsed laser energy to bring about vaporization of the starting material. The amount of energy required will vary depending on variables such as thermal and optical properties and type of starting material.

The laser beam preferably vaporizes the starting material directly, without the material undergoing a prolonged liquid phase transformation. The types of lasers that can be employed to generate the laser energy used in the practice of this invention include several lasers commercially available. For example, laser energy may be provided by the second harmonic of a pulsed Nd-YAG laser at 532 nm with 15–40 mJ/pulse at $10^{-8}$ second pulse.

In producing nanoparticles, the vapor produced in the method of the invention can be cooled or condensed by subjecting the vapor phase to collisions with an inert gas.

In a preferred embodiment, the method of the invention may be used for the synthesis of nanoparticles of intermetallic alloys. Such intermetallic alloys include, but are not limited to, iron aluminides such as FeAl or $Fe_3Al$, nickel aluminide such as NiAl, titanium aluminide such as TiAl and other intermetallic compounds such as brass and Fe—Co—V alloys. The nanocrystalline intermetallic powders can be used for magnetic bar coding, electric circuits, catalysts to synthesize organic and inorganic compounds, and in resistive ink for thin film electronic circuits.

In one embodiment, the invention provides a method of synthesizing nanoparticles of controlled size and composition. The method combines the advantages of pulsed laser vaporization with controlled condensation in a diffusion cloud chamber under well-defined conditions of temperature and pressure.

Figure 1:
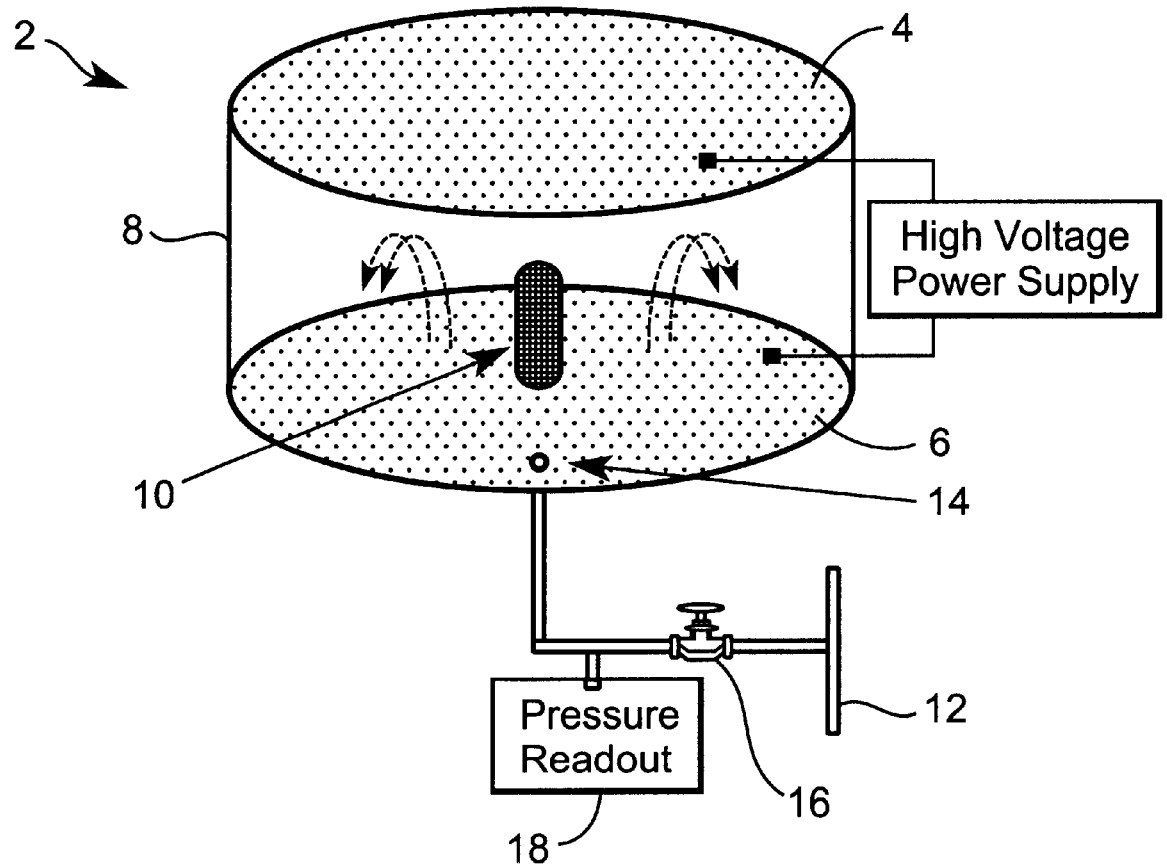
FIG. 1 shows an experimental setup for the Laser Vaporization Controlled Condensation (LVCC) technique which includes a diffusion cloud chamber in accordance with the invention.

The method employs pulsed laser vaporization of at least one metal target into a selected gas mixture in a modified diffusion cloud chamber. Details of suitable diffusion cloud chambers can be found in The Journal of Chemical Physics, Vol. 52, No. 9, May 1, 1970, pp. 4733–4748, the disclosure of which is hereby incorporated by reference. The laser vaporization produces a high-density vapor within a very short time, typically $10^{-8}$ sec, in a directional jet that allows directed deposition. Laser vaporization is possible from several targets simultaneously, yielding alloys or mixtures of nanoparticles. Details of a LVCC chamber 2 suitable for production of nanoparticles is shown in FIG. 1.

The chamber 2 includes two horizontal, circular stainless steel plates 4, 6, separated by a glass side wall 8. A metal target 10 of interest is placed in the chamber, e.g., on the lower plate, and the chamber is filled with a carrier gas such as pure He or Ar (99.99% pure) or a mixture containing a known composition of a reactant gas with a carrier gas (e.g. $O_2$ in He in the case of forming oxides; $N_2$ or $NH_3$ in He for forming nitrides, isobutene in He for forming carbides, etc.). The metal target and the lower plate are preferably maintained at a temperature higher than that of the upper plate (e.g., temperatures can be controlled by circulating fluids.) For example, the top plate can be cooled to less than 150 K by circulating liquid nitrogen in fluid passages in the top plate. A large temperature gradient between the bottom and top plates can create a steady convection current which can be enhanced by using a heavy carrier gas such as Ar above atmospheric pressure conditions in the chamber (e.g., 1–3× $10^3$ Torr).

The metal vapor can be generated in the chamber by pulsed laser vaporization using the second harmonic (532 nm) (optionally combined with the fundamental (1064 nm)) of a Nd-YAG laser (50–100 mJ/pulse, $10^{-8}$ second pulse). The laser beam can be moved across the metal surface in order to expose new target material to the beam and thereby maximize the amount of metal vapor produced. Following each laser pulse, the thus ejected metal atoms interact with the gas mixture in the chamber. Both diffusion and convection aid in removal of the small particles away from the nucleation zone (once condensed out of the vapor phase) before they can grow into larger particles.

By controlling the temperature gradient, the chamber pressure and the laser power (which can be used to determine the number density of the metal atoms released in the vapor phase, e.g., on the order of $10^{14}$ metal atoms per pulse), it is possible to control the size of the condensing particles. The operating pressure in the chamber is preferably between $10^{-3}$ and $3\times10^3$ Torr, and more preferably between $10^3$ and $3\times10^3$ Torr. By adjusting the temperature gradient in the reaction chamber and utilizing the vapor convection as a means of removing the nucleated nanoparticles from the nucleation zone before they grow into larger particles, one can control the process of condensation and consequently the size of the nanoparticles. The temperature gradient can be adjusted by altering the temperatures of the top and/or bottom plates of the chamber. The temperature of the upper plate is preferably between –150° C. and 30° C . The temperature of the lower plate is preferably between 20° C. and 150° C. Also, in order to prevent condensation on the side wall 2, the side wall can be heated, e.g., resistance heater wires surrounding the outer periphery of the side wall can be used to heat the side wall.

The method is preferably performed with an inert environment of helium or argon at pressures higher than atmospheric pressure in the chamber, which eliminates the possibility of atmospheric contamination during the synthesis. However, as indicated above, the reaction may also be carried out at pressures lower than atmospheric pressure.

An added advantage of this method is the capability of preparing selected oxide intermetallic nanoparticles by precisely introducing known concentrations of oxygen into the reaction chamber.

The method of the invention may also be used to produce carbide intermetallic nanoparticles. When these carbides are desired, the reactive mixture contains an inert carrier gas and a carbon-containing gas such as a hydrocarbon, e.g. isobutene.

The method is based on combining the advantages of pulsed laser vaporization with the control of the condensation process from the vapor phase under well defined conditions of temperature and pressure in a diffusion cloud chamber. The collisions between the primary particles undergoing Brownian motion during the gas-to-particle conversion results in the formation of nanoparticle aggregates. The structure of the aggregates can be varied from very open web-like structures to compact assemblies of primary nanoparticles. Since the laser vaporization process produces a mixture of mostly atoms and a small fraction of ions, it is expected that both neutral and charged (by ions or free electrons) nanoparticles are formed during the evaporation/condensation processes. Considering this phenomenon, it should be possible to influence the growth mechanism and the structures of the aggregates by applying an electric field during the formation of nanoparticles.

Intermetallic FeAl nanoparticles have been prepared using the laser vaporization controlled condensation technique according to the invention. Measurements of the d-spacing from X-ray and electron diffraction studies confirm that the FeAl nanoparticles have the same crystal structure (B2) as the bulk FeAl. The nanoparticles have an average particle diameter between 6–9 nm and exhibit an Al-rich surface composition. In contrast to the bulk target alloy, the FeAl nanoparticles show room temperature magnetization.

In an additional embodiment of the method of the invention, the laser energy is supplied in the presence of an electric field so as to form filaments, filament-like and tree-like aggregates of several metallic and intermetallic nanoparticles under the influence of an electric field. The chains and the tree-like aggregates display stretch and contraction properties depending on the strength of the applied field. The electric field may be applied at 30 to 300 V/cm.

The following examples are illustrative of the invention and are not to be construed to limit the scope of the claims.

General Materials and Methods

Glass slides are deposited onto the top plate to examine the morphology of the as-deposited particles using a Jeol JSM-T300 scanning electron microscope (SEM).

X-Ray diffraction (XRD) patterns were obtained using a Philips X'Pert Materials Research Diffractometer which uses Cu $K_{\alpha 1}$ radiation. The size and shape of the individual particles were investigated using a Jeol JEM-200FXE transmission electron microscope (TEM) operated at 200 kV, which was also equipped with a Tracor Northern 5500 EDX analysis system for compositional analysis. High resolution TEM images were obtained using the Jeol-4000EX operated at 400 kV.

DC (SQUID) and low field AC-susceptibility measurements have been carried out to investigate the onset of exchange anisotropy in the nanoparticles material. In the moment versus temperature study, Zero-Field Cooled (ZFC)/Field Cooled (FC) measurements were made with 2, 10 and 100 Oe. The ZFC measurements were performed by cooling the sample to 5 K at zero field and then applying 20 G field for the warming up scan. In the moment versus field study, hysteresis loops have been acquired at 5 K and several other temperatures up to 300 K. Between every loop the sample was warmed up to 300 K and the remanence field was minimized.

General Method

The experimental setup for the LVCC technique includes a diffusion cloud chamber 2 as shown in FIG. 1. Two circular horizontal stainless steel plates denoted as the top cold plate 4 and the bottom hot plate 6 are separated by a glass ring 8 with a 6" outer diameter. A bulk target 10 of interest is set on the bottom plate 6, and may be contained in a sample holder. The reaction chamber 2 is connected to a gas supply 12 through a gas inlet hole 14 situated on the bottom plate. The gas supply is isolated from the chamber by a control valve 16. The pressure in the chamber and within the gas lines is monitored through a Barocel pressure sensor 18 and readout 20 which are coupled into the gas line. The chamber and the gas line can be evacuated to a base pressure of approximately $10^{-1}$ torr. During each experimental run the chamber is filled with either a high purity carrier gas such as He or Ar or a reactive mixture, which contains a known composition of a reactive gas seeded within a carrier gas. The reactive mixtures used may be oxygen in helium for oxide formation, olefins in helium for carbide formation and nitrogen or ammonia in helium for the production of nitrides. Prior to each run the chamber is filled and evacuated several times with the carrier gas to ensure removal of any trace residual impurities from the chamber. The vapor of interest is created in the chamber by focusing the output of the second harmonic of a Q-switched ND:YAG laser ($\lambda$-At 532 nM; 10 ns pulse duration) onto the bulk target. Typically the laser is run at 20 Hz and delivers a power of 15–40 mJ/pulse onto the sample.

A steady convection current is created within the chamber. The steady convection current can be achieved in two ways; either the top plate is cooled by circulating liquid nitrogen and the bottom plate is kept at room temperature or the bottom plate is heated by circulating heating fluid and the top plate is kept at room temperature. In either case, the top plate is kept at a temperature significantly lower than the bottom plate, which makes it the condensation or deposition plate. Nichrome heating wires wrapped around the glass ring heat the gas ring to prevent deposition on the glass and also to ensure a uniform temperature gradient between the two plates. The temperatures of the plates are monitored using thermocouples attached to each plate and connected in parallel to an Omega DP460 temperature readout.

During each run the laser beam is moved several times to expose new surfaces of the target to ensure good reproducibility of the desired vapor following each laser pulse. The atoms ejected from the surface of the bulk target interact with the atmosphere in the chamber. The temperature of the chamber atmosphere decreases as the top plate is approached resulting in maximum supersaturation developing in the upper half of the chamber. The higher the supersaturation, the smaller will be the size of the nucleus required for condensation. The supersaturation in the chamber may be enhanced by changing the temperature gradient. Convection plays a role in getting the particles out of the nucleation zone before they grow larger in size. Convection within the chamber may be enhanced by increasing the temperature gradient or by using a heavier carrier gas (argon as compared to helium). Thus, by controlling the laser power, the temperature gradient and the chamber pressure it may be possible to control the size and/or shape of the condensing particles. After a typical run, which lasts for two hours, the chamber is brought to room temperature and the sample is collected and stored under atmospheric conditions.

EXAMPLE 1

Identification of the Phases Formed in Nanocrystalline FeAl Particles

Figure 2:
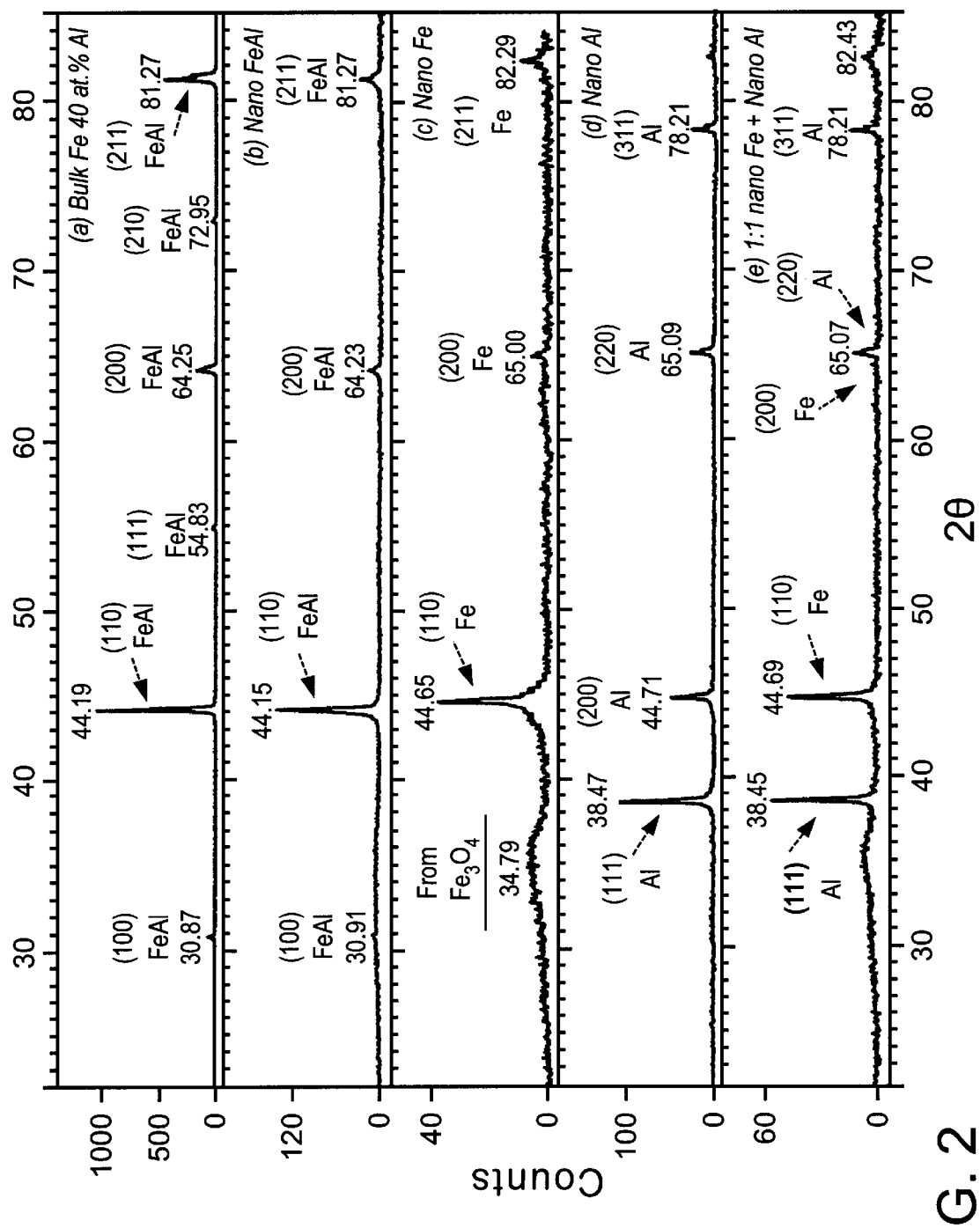
FIG. 2 shows X-ray diffraction patterns for nanoparticles prepared from bulk FeAl powder graph (a), FeAl nanoparticles prepared according to the invention graph (b), Fe nanoparticles graph (c), Al nanoparticles graph (d) and a 1:1 mixture of Fe and Al nanoparticles (graph)

In order to compare the properties of the FeAl nanoparticles with those of Al and Fe, nanoparticles were prepared by laser vaporization of bulk targets of Al and Fe, respectively. FIG. 2 shows the XRD pattern obtained from: a) bulk, non-magnetic FeAl powder with 24% Al (weight percent) and an average particle size of 47 μm prepared by a water atomization technique; b) FeAl nanoparticles prepared by the LVCC method from a bulk alloy containing 24% Al (weight percent); c) Fe nanoparticles prepared by the LVCC method from a bulk Fe target (99.9% pure); d) Al nanoparticles prepared by the LVCC method from a bulk Al target (99.9% pure), and e) a 1:1 mixture (by weight) of the Fe and Al nanoparticles.

The XRD pattern of the FeAl nanoparticles (graph a) exhibits prominent peaks at scattering angles (2θ) of 30.91, 44.15, 64.23 and 81.27 which are assigned to scattering from the 100, 110, 200 and 211 planes, respectively of the FeAl crystal lattice. This indicates that the nanoparticles have the same crystal structure as that of bulk FeAl (B2-CsCl type structure). However, as compared to the XRD of the bulk powder (47 μm particle's size), the peaks of the nanoparticles sample are broader due to the smaller size of the particles.

The XRD pattern of the Fe nanoparticles (graph c) exhibits three strong peaks at scattering angles (2θ) of 44.65, 65.00 and 82.29, which can be assigned to the crystalline Fe lines 110, 200 and 211. The XRD spectrum of the Al nanoparticles (graph d) shows peaks at scattering angles (2θ) of 38.47, 44.71, 65.09 and 78.21, which can be assigned to the four strongest crystalline Al lines 111, 200, 220 and 311, respectively. The lattice parameter for the unit cell of Fe and Al nanoparticle samples were calculated using the CELL Ver 5.0 program assuming cubic symmetry in both cases. The calculated lattice parameters for Fe and Al are 2.8661 and 4.0504, respectively which are in good agreement with the known lattice parameters for bulk Fe and Al (2.8664 and 4.0494, respectively). PCPDFWIN X-Ray Database, Version 2.00 (JCPDS-ICDD) (1998).

The XRD patterns of Fe and FeAl nanoparticles are sufficiently different to allow the identification of Fe impurity in the FeAl sample. No Fe lines could be identified within the XRD pattern of the FeAl nanoparticles, which indicates the absence of any significant pure Fe impurity in the sample. Also, the absence of a peak around 2θ values of 26 confirms that the nanoparticle sample does not contain any significant phase contamination from $Fe_3Al$ phase as was observed by other researchers who used ball milling techniques to prepare FeAl nanoparticles.

The corresponding d-spacing values and a comparison between the intensity of the XRD peaks measured for the nanoparticle sample with the known intensities reported for the (B2) bulk FeAl alloy are presented in Table 1.

TABLE 1

| Diffraction angle (2θ deg) | d-spacing ($d_{hkl}$ Å) | (h k l) | Database Intensity for bulk FeAl alloy (%) | Intensity for nanoparticle sample (%) |
| --- | --- | --- | --- | --- |
| 30.74 | 2.903 | (100) | 8 | 4 |
| 44.11 | 2.049 | (110) | 100 | 100 |
| 64.19 | 1.449 | (200) | 11 | 15 |
| 81.17 | 1.183 | (211) | 20 | 25 |
| 97.39 | 1.025 | (220) | 8 | 8 |

As shown Table 1, the intensity ratios exhibit reasonable agreement between the nanoparticle sample and the reported data for the bulk FeAl alloy. This indicates that the nanoparticles have the same crystal structure as that of bulk FeAl (B2-CsCl type structure). The absence of a peak around a 2θ value of 26 confirms that the nanoparticle sample does not contain any significant phase contamination from $Fe_3Al$ as reported by researchers who describe ball milling to synthesize the FeAl nanoparticles. See, e.g., Amilis, X., et al., Nanostructured Materials 12:801 (1999). The calculated lattice parameter (2.8984) of the FeAl nanoparticles of the invention is also in good agreement with the known lattice parameter for bulk FeAl (2.8954). PCPDFWIN X-Ray Database, Version 2.00 (JCPDS-ICDD) (1998).

Morphology and Size Distribution of Nanoparticles

Figure 3:
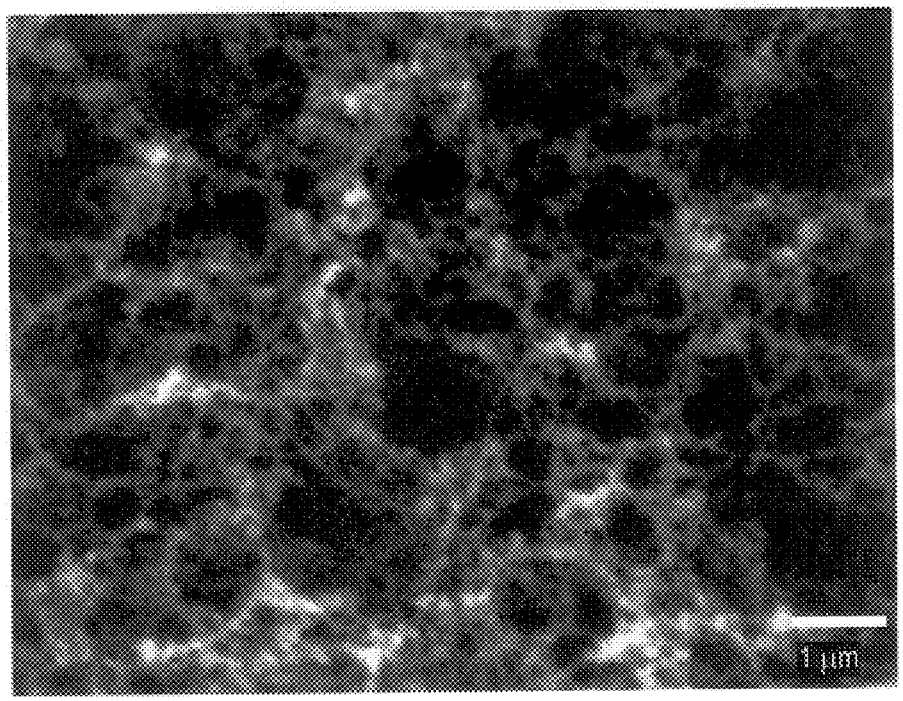
FIG. 3 shows a SEM image of the as-deposited FeAl nanoparticles under 7.5 K magnification.

The morphology of the as-deposited particles, as characterized using SEM (Jeol JSM-T300) indicated that the nanoparticles have a highly organized weblike structure as shown in FIG. 3. The FeAl nanoparticles prepared by the LVCC method are black in color.

Figure 4:
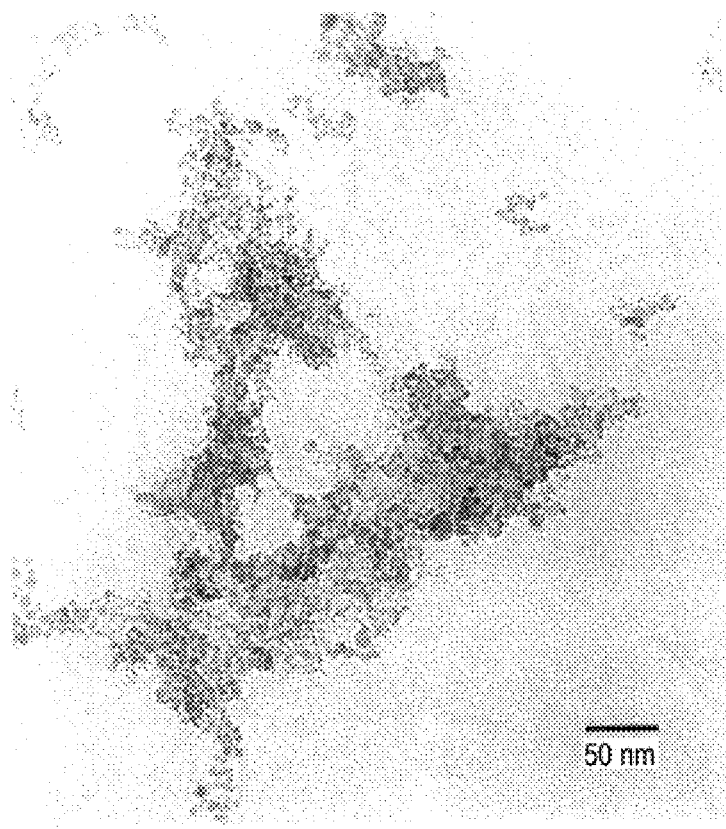
FIG. 4 shows a TEM image obtained under 150 K magnification for FeAl nanoparticles prepared from bulk FeAl (24 wt. %Al) target.

The size and shape of the individual particles were investigated by TEM (Jeol JEM-200FXII TEM operated at 200 kV). The nanocrystalline FeAl particles were found to be either spherical or oval in shape as evident from the TEM bright field image displayed in FIG. 4. The size distribution calculated from several TEM images indicated that the average particle diameter is in the range of 6–9 mn with a few (1–2%) large size particles that may be approximately 40–50 nm in diameter. Energy dispersive X-ray (EDX) analysis indicated the presence of peaks corresponding to emissions from both Fe and Al in the FeAl nanoparticle sample.

X-Ray Photoelectron Spectroscopy (XPS) of the FeAl nanoparticles indicates that the particles have an Al-rich surface composition. For example, the Al/Fe ratio from the XPS spectrum of the nanoparticles prepared from a bulk target with a composition of Fe-40at%Al is 3.9. The nanoparticles exhibit room temperature magnetization in contrast to the bulk FeAl target used in the preparation of the nanoparticles.

Figure 5:
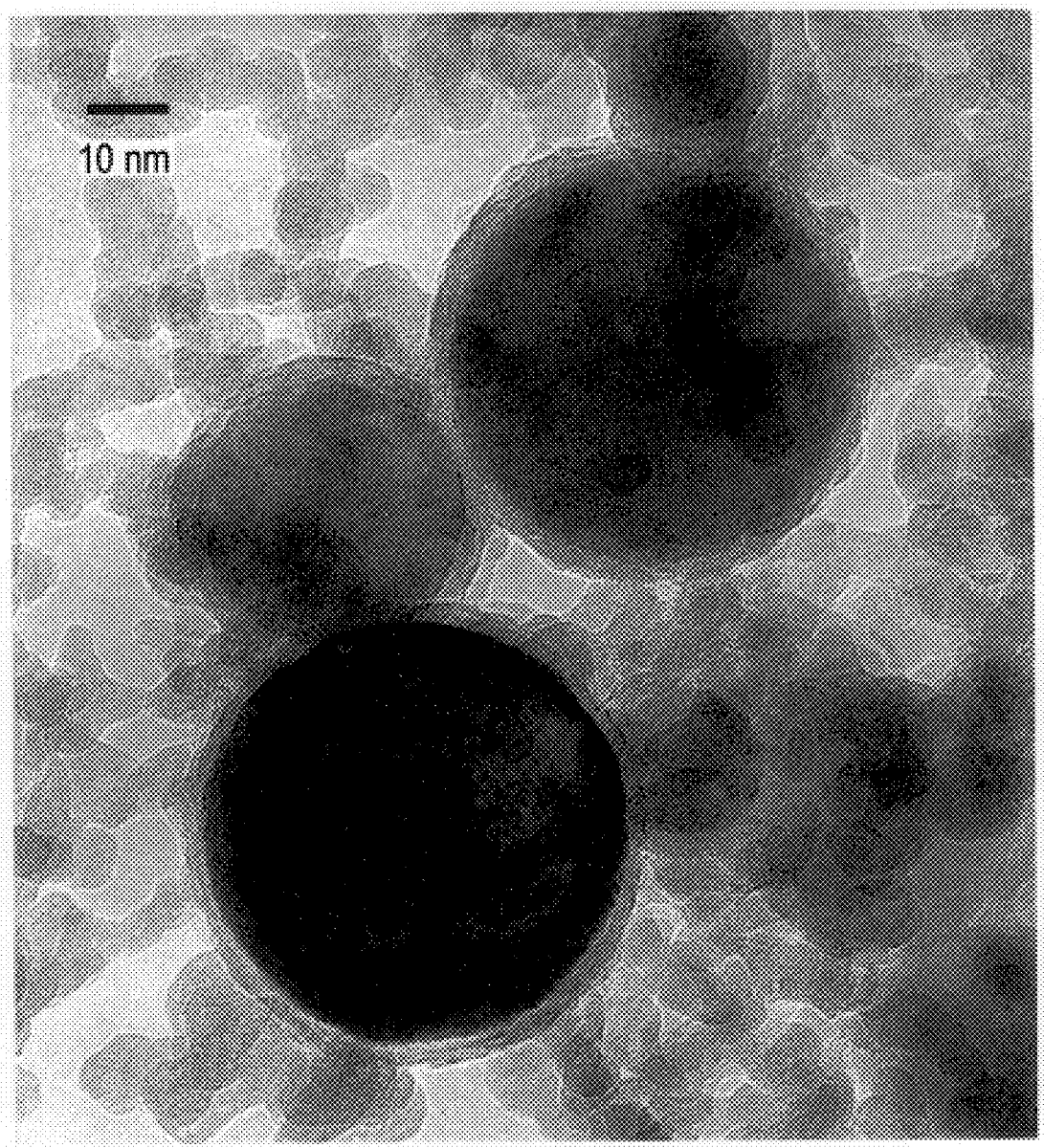
FIG. 5 shows a HRTEM image obtained under 500 K magnification for FeAl nanoparticles wherein the particles include a thin (approximately 1–2 nm) amorphous coating around a crystalline core.

High resolution TEM images revealed that the nanoparticles consist of crystalline core incased with a ≈1 nm amorphous layer formed upon the exposure of the particles to air as shown in FIG. 5.

In order to demonstrate that the formation of the amorphous surface layer around the FeAl nanoparticles was not a result of oxygen contamination during the particles' formation, FeAl nanoparticles were prepared in the presence of oxygen in He atmosphere. In both cases, the particles were exposed to air after removal from the preparation chamber. It is clear that in the presence of $O_2$, FeAl oxide nanoparticles are formed. The XRD pattern of these oxide nanoparticles is consistent with the hercynite phase $FeAl_2O_4$. Therefore, it can be concluded that the surface oxide layer formed upon the exposure of the FeAl nanoparticles to air does not contain the hercynite composition $FeAl_2O_4$ which is formed by adding $O_2$ during the preparation of FeAl nanoparticles. By adding $O_2$ during the preparation of pure Fe and Al nanoparticles, resulting oxides formed include $Fe_3O_4$ and $Al_{2.66}O_4$ oxide.

EXAMPLE 2

Magnetic Intermetallic FeAl Nanoparticles

Figure 6B:
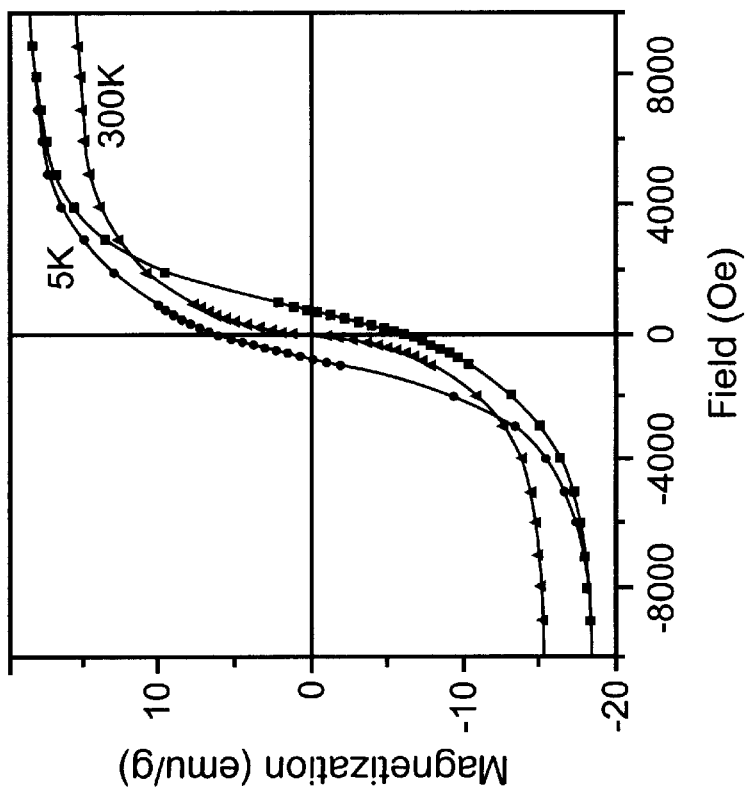
FIG. 6B shows hysteresis loops at different temperatures of the FeAl nanoparticles.
Figure 6A:
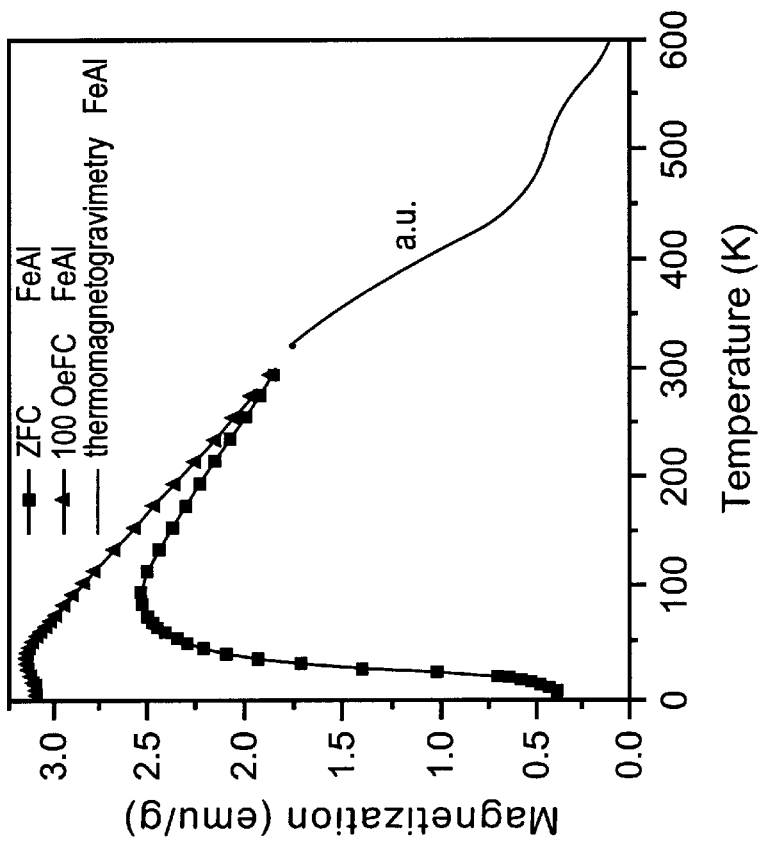
FIG. 6A shows magnetization (emu/g) versus temperature of the FeAl nanoparticles.

SQUID measurements were carried out in order to confirm the ferromagnetic behavior of FeAl nanoparticles produced by the method of the invention. FIGS. 6A to 6B displays the ZFC and FC moment versus temperature measurements of the FeAl nanoparticles. The increased FC moment compared to the ZFC moment at low temperatures becomes more pronounced with increasing field. At 100 Oe the FC moment at 5 K is about ten times the ZFC moment, at 2 Oe the difference is only a few percent. A thermomagnetogravimetric measurement was also performed to check the temperature dependence above room temperature and the result is shown in FIGS. 6A to 6B. The magnetization appears to decrease regularly with temperature and a Curie temperature around 450 K is apparent.

Hysteresis loops have been acquired at 5 K and several other temperatures up to room temperature (300 K) as shown in FIGS. 6A–6B. For ZFC, the loops are symmetric. The moment at 5 K and 10 K Oe corresponds to about 20 emu/g, which is about 10% of the value of pure iron. However, the sample is not completely saturated at 10 k Oe. The coercivity is around 50 Oe at room temperature down to about 50 K, below which it increases; at 5 K it is more than 700 Oe. FC loops show that the material seems to exhibit exchange anisotropy. There is a definite field shift of more than 100 Oe (exchange bias) at 5 K. This bias quickly drops with temperature, so it is barely noticeable at 20 K.

EXAMPLE 3

Synthesis of Carbides and Oxides

Figure 7A:
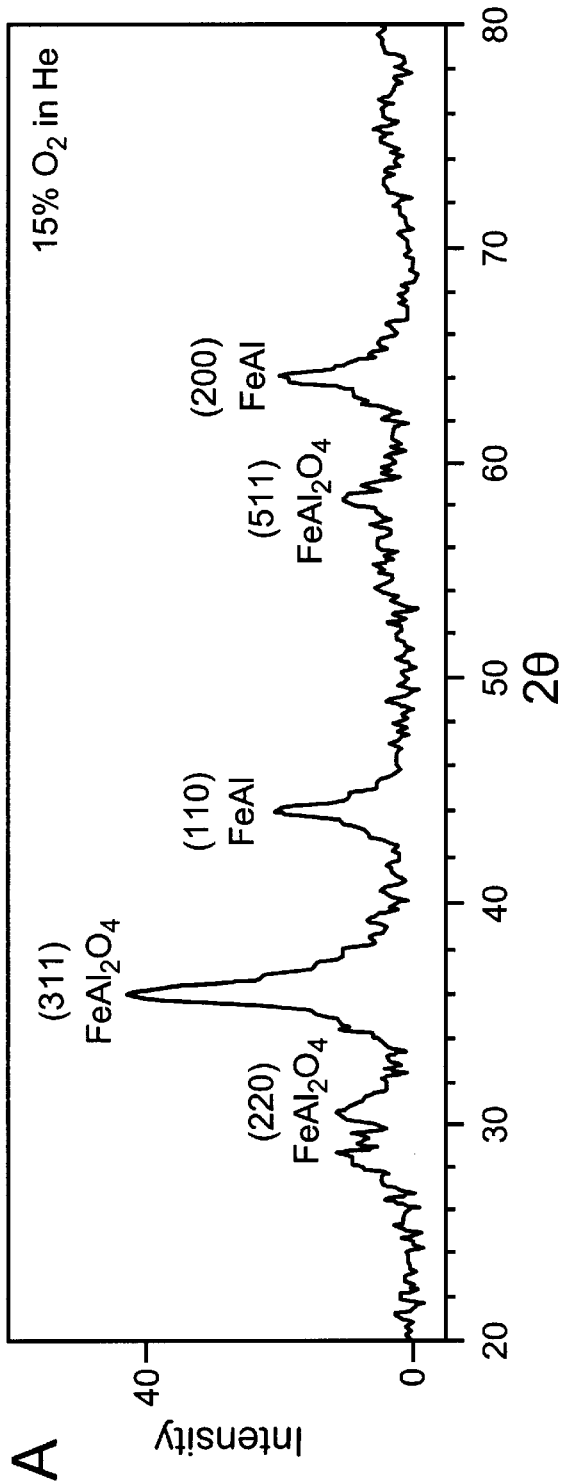
FIG. 7 shows X-ray diffraction patterns (a–b) for nanoparticles prepared from bulk FeAl (24% wt. Al) using 15% Oxygen in He graph (a) and 15% isobutene in He graph (b)
Figure 7B:
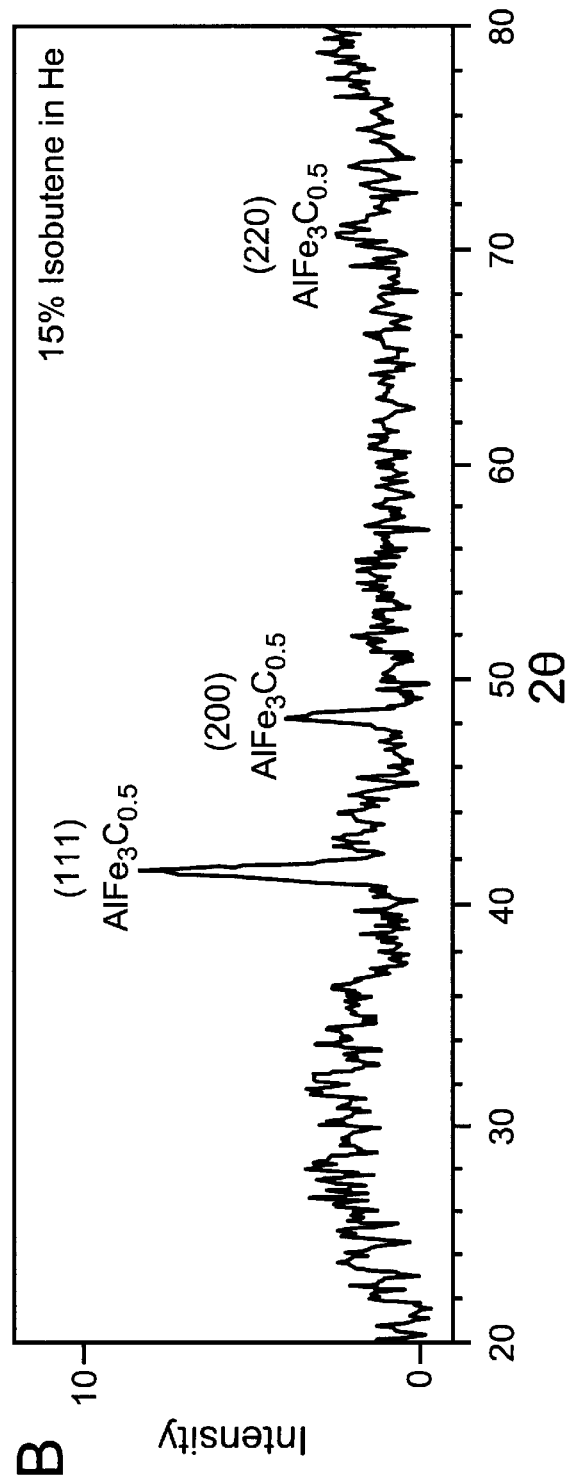

In order to demonstrate the synthesis of oxide and carbide FeAl nanoparticles, FeAl nanoparticles were prepared in the presence of variable concentrations of oxygen and isobutene, respectively in He atmosphere. FIGS. 7A to 7B displays the XRD patterns of the FeAl nanoparticles prepared: a) 15% $O_2$ in He, and b) 15% isobutene in He. In all cases, the particles were exposed to air after removal from the preparation chamber. In the presence of $O_2$, FeAl oxide nanoparticles are formed. The XRD pattern of these oxide nanoparticles is consistent with the hercynite phase $FeAl_{2O4}$. In presence of isobutene, FeAl-carbide is mainly formed. For the carbide nanoparticles, the XRD pattern is consistent with the composition $AlFe_3C_{0.5}$.

In order to set up a comparison, samples were also prepared by adding 15% $O_2$ during the preparation of pure Fe and Al nanoparticles. The resulting oxides have the $Fe_3O_4$ and $Al_{2.66}O_4$ compositions, respectively. Based on the similarities in the XRD pattern it appears that the $FeAl_2O_4$ oxide has similar crystal structure to the $Fe_3O_4$ oxide, where two Al atoms replace two Fe atoms in $Fe_3O_4$ to form the hercynite $FeAl_2O_4$.

EXAMPLE 4

Simultaneous Vaporization of two Metallic Targets

This Example presents the initial results obtained in attempting to prepare FeAl nanoparticles by simultaneously evaporating two separate metallic bulk Fe and Al targets and then allowing subsequent diffusion in the gas phase.

Figure 8:
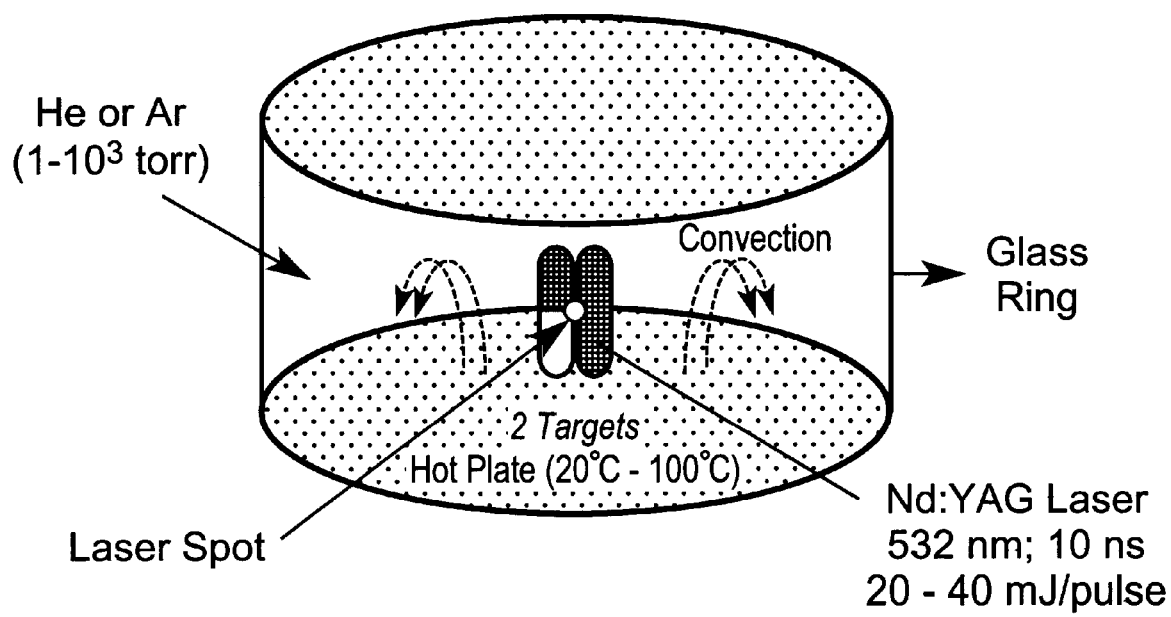
FIG. 8 shows an experimental setup for the simultaneous vaporization of two metallic targets.
Figure 9A:
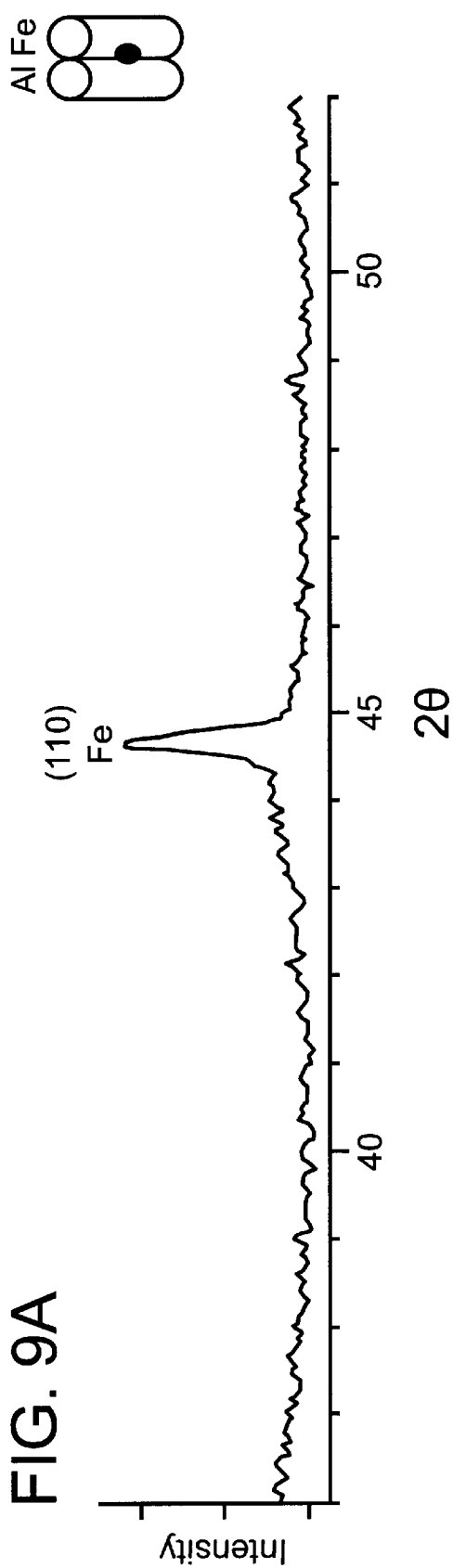
FIG. 9 shows X-ray diffraction patterns (a–d) obtained from nanoparticles prepared by laser vaporization of Fe and Al using different positions of the laser spot on the targets.
Figure 9B:
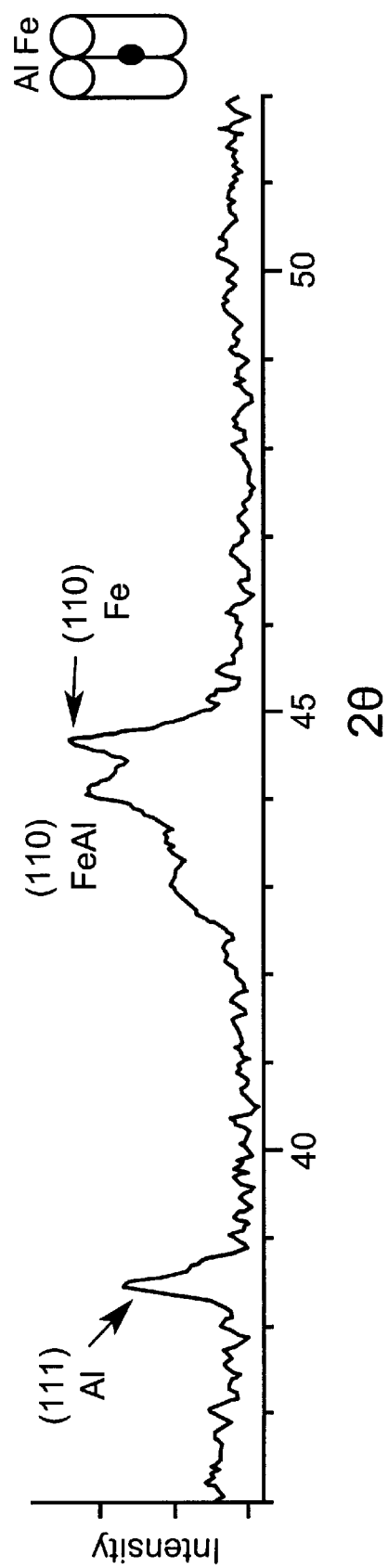

FIG. 8 shows details of an experimental setup for the two target experiment. Some of the variables which could result in different phases being formed in this experiment are the type and pressure of the inert gas used in the chamber, the temperatures of the plates, the laser power and, most significantly, how the intensity of the laser spot is split on the two bulk targets.

FIGS. 9(a)–(d) show x-ray spectrums obtained from samples that were prepared by splitting the laser spot between the two bulk targets in four different ways. All other preparation conditions were kept constant. The x-ray diffraction pattern shown in graph a was obtained from a sample that was prepared with the laser spot being predominantly on the Fe target. As expected, the peak corresponding to diffraction from the (110) plane of Fe is observed. No peaks corresponding to diffraction from the (110) plane of FeAl or the (111) planes of Al were observed. The x-ray shown in graph b was obtained from a sample where the laser spot was moved such that 50% of it is on Fe and 50% is on the Al target. Peaks were observed corresponding to Fe, Al and FeAl, all in comparable intensity with each other. The (110) peak of Fe may contain some contribution from the (200) peak of Al. It is difficult to separate these two peaks in the samples, as there is considerable broadening within the x-ray peaks due to the samples being nanometer in size. In graph c the spot is approximately 70% on the Al target and 30% on the Fe target. The Al diffraction peaks grew stronger in intensity and the (110) FeAl peak decreased considerably in intensity. Some peaks, which could be possibly assigned to the presence of the $FeAl_3$ phase in the sample, were observed. For graph d the spot is almost all on Al (>95%). The only peaks observed can be assigned to diffraction from the (111) and (200) planes of Al. Thus, by controlling the position of the laser spot in a binary evaporation it is possible to achieve preferential formation of one phase over the others within a mixture.

EXAMPLE 5

Synthesis of Nanoparticle Filaments

Using the LVCC method, the effect of the electric field on the growth morphology of several metallic (Fe, Cu, Zn and Ti) and intermetallic (FeAl, TiAl and CuZn) nanoparticles was investigated. In addition, nanoparticles generated from the laser vaporization of graphite were studied.

Figure 10A:
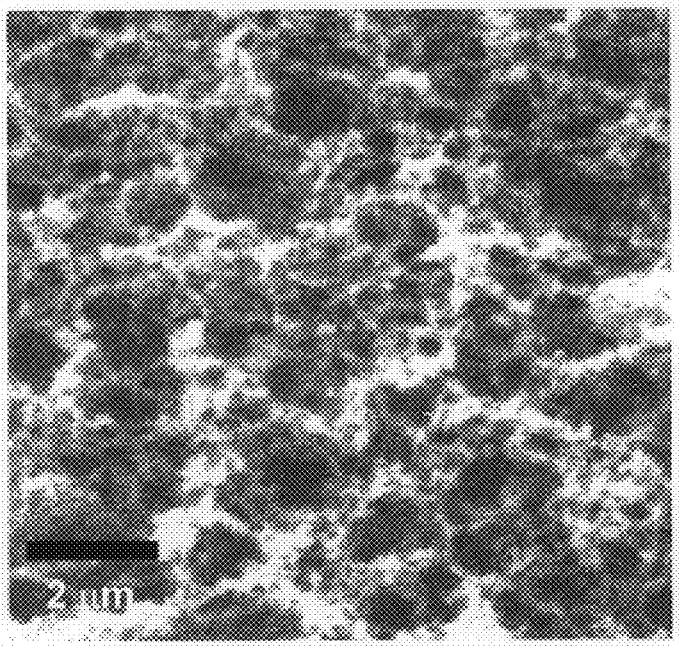
Figure 10B:
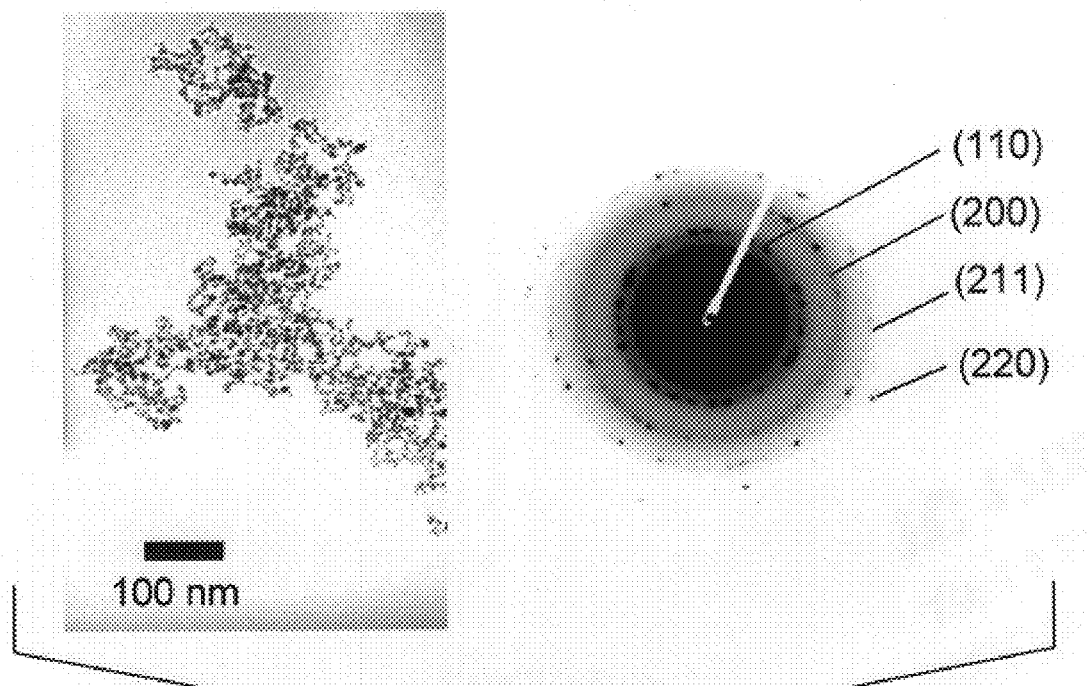

FIG. 10a shows the SEM image of the as-deposited FeAl nanoparticles prepared with no electric field applied between the chamber plates. The as-deposited nanoparticles on glass substrates exhibit organized web-like morphology. The primary spherical nanoparticles are aggregated into long chains and strands. The strands are linked together into closed loops, which form a web-like network. The web-like network is characterized by well-defined pores with diameters of 1–2 μm. FIG. 10b shows the TEM image and ED in insert and FIG. 10c shows the XRD pattern of the FeAl intermetallic nanoparticles. The size distribution calculated from several TEM images indicates that the primary particles have average diameters in the range of 7–9 nm with a few percent (≈2%) larger particles that are approximately 40–50 nm in diameter.

Figure 11A:
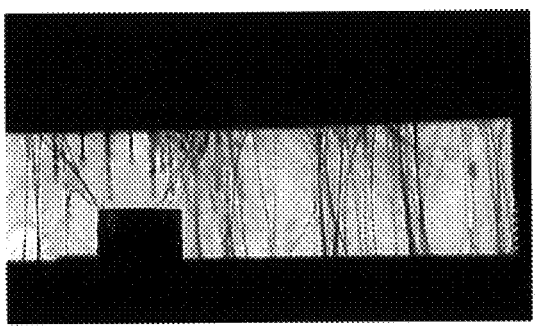
FIGS. 11a–d show effects of forming FeAl nanoparticles under the influence of an electric field wherein FIG. 1 a shows FeAl filaments during the early growth time under the influence of 60 V/cm field.

FIG. 11(a) shows photographs of the LVCC chamber during the preparation of the FeAl nanoparticles with an electric field of 60 V/cm applied between the bottom and top plates of the chamber. The nanoparticles aggregate as little chains and stack end to end. Generally the chains grow perpendicular from the top and bottom plates of the LVCC chamber as shown in FIG. 11(a). Eventually, the chains bridge the top and bottom metal plates (electrodes), indicating that both negatively and positively charged particles are involved Also, since no electric shortage is observed when the chains bridge the electrodes, it appears that the units in the chain are not actually in contact but are kept apart by small separations enough for molecular forces to be effective. The XRD and ED of the nanoparticles of the chain aggregates are similar to those obtained from the nanoparticles prepared in the absence of the field, thus indicating that the field has no effect on the composition of the particles. However, the TEM images indicate that the particles prepared in the presence of the field have slightly smaller diameters (6–8 nm) and more homogenous distribution with very few larger particles (40–50 nm).

Figure 11B:
Figure 11C:
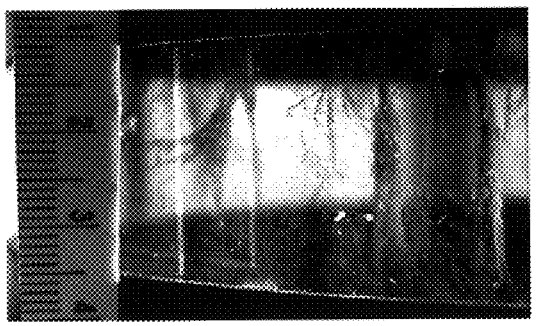

The filament-like chains grow into 3D tree-like structures with increasing vaporization times as shown in FIG. 11(b). Like magnets, two chain aggregates repelled one another when their like charges were facing each other. The repulsion was unstable, however, and the chains would then swing around very rapidly and stick together. In other words, the chain rotates to orient their dipoles so that the positive end would face the negative end, thus attracting one another. With reference to FIG. 11(c), it has been observed that the aggregates stretch under an increased applied field and when the field is turned off, the aggregates contract. The chains can be made to rotate by increasing the electric field and in some cases; the branches rotate while the trunks remain stationary.

Figure 11D:
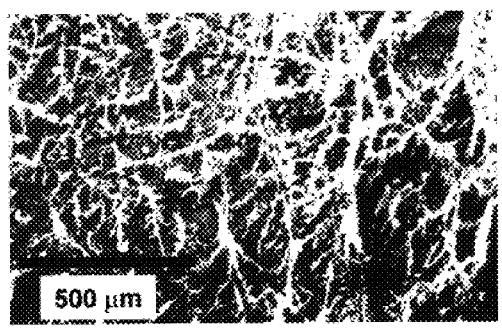

FIG. 11(d) shows an SEM image of the as-deposited FeAl filaments on a glass slide placed on the top plate of the LVCC chamber. The filament and fiber morphology is quite different from the web-like morphology observed with no electric field applied during the experiment.

The metal oxide and carbide nanoparticles did not display the formation of chain-like or tree-like aggregates in the presence of electric fields. For example, FeAl oxide ($FeAl_2O_4$) and carbide ($AlFe_3C_{0.5}$) nanoparticles have been prepared by the laser vaporization of the bulk FeAl alloy in oxygen-He and isobutene-He mixtures, respectively in the presence of electric field (up to 100 V/cm) between the chamber plates. No filaments were observed and the nanoparticles showed the same pattern of aggregation as in the absence of the field. This suggests that the oxide and carbide nanoparticles may have a negligible amount of charges on the surface thereof.

Enormous electrostatic aggregation due to dipole forces was observed between nanoparticles to form chain aggregates, and between the chain aggregates to form tree-like filaments. The filament-like and tree-like aggregates may have special applications, for example, as fillers (additives) to increase the elastic modulus and tensile strength of polymers such as low strength rubbers. This may allow for stronger interactions between the polymer chains and the nanoparticle chain aggregates.

Figure 12:
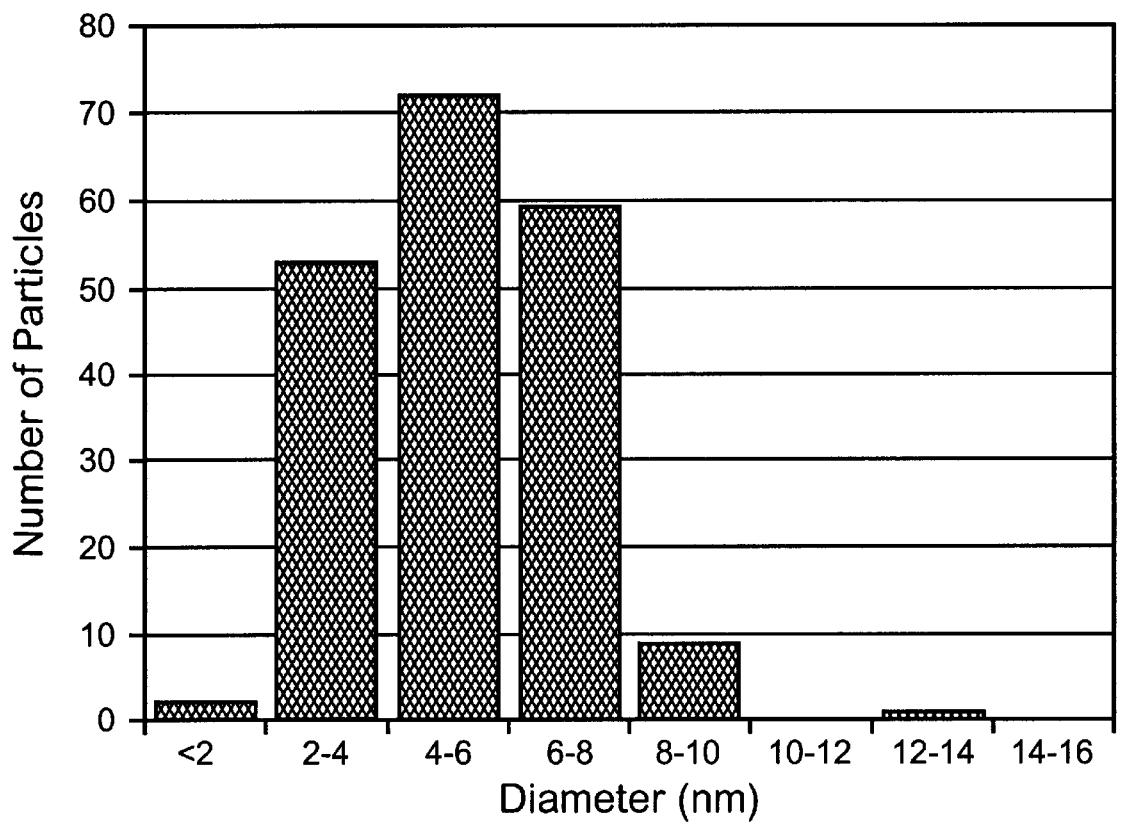
FIG. 12 shows particle-size distribution for FeAl nanoparticles produced in accordance with the method of the invention.

FIG. 12 is a graph of particle size distribution for FeAl nanoparticles produced in accordance with the invention. As shown, it is possible to produce nanoparticles having sizes of 2–10 nm, with most of the particles having sizes of 2–8 nm.

While the invention has been described with reference to preferred embodiments, it is to be understood that variations and modifications may be resorted to as will be apparent to those skilled in the art. Such variations and modifications are to be considered within the purview and scope of the invention as defined by the claims appended hereto.

What is claimed is:

1. A method of making intermetallic nanoparticles comprising subjecting a starting material to laser energy so as to form a vapor and condensing the vapor so as to form intermetallic nanoparticles.

2. The method according to claim 1, wherein the starting material is a metal alloy.

3. The method according to claim 1, wherein the intermettalic nanoparticle have a a particle size of between 2–100 nm.

4. The method according to claim 1, wherein vaporization by the laser is provided by the second harmonic of a Nd-YAG laser at 532 nm with 15–40 mJ/pulse.

5. The method according to claim 1, wherein the laser energy is supplied in the presence of an electric field so as to form filaments, nanowires or nanotubes.

6. The method according to claim 1, wherein the vaporization and condensing are carried out in a reaction chamber.

7. The method according to claim 1, wherein the reaction chamber has an upper portion and a lower portion and wherein a higher temperature is maintained in the lower portion than in the upper portion such that the condensing occurs in the upper portion.

8. The method according to claim 6, wherein an inert carrier gas or a reactive mixture containing an inert carrier gas and a reactive gas is added to the chamber.

9. The method according to claim 8, wherein the inert carrier gas is helium, argon or another inert gas.

10. The method according to claim 8, wherein the reactive mixture contains an inert carrier gas and isobutene.

11. The method according to claim 9, wherein the intermetallic nanoparticles are comprise a metal carbide.

12. The method according to claim 6, wherein the reactive mixture is oxygen in an inert gas.

13. The method according to claim 6, wherein the intermetallic nanoparticles are oxide intermetallic nanoparticles.

14. The method according to claim 5, wherein the electric field is applied at 30 to 300 V/cm.

15. The method according to claim 1, wherein the starting material comprises a first target of a first material and a second target of a second material different than the first material.

16. The method according to claim 1, wherein a beam of the laser energy strikes the starting material such that the beam is moved relative to the starting material.

17. The method according to claim 1, wherein the vapor is contained in a chamber having a controlled pressure therein, the pressure being in the range of $10^{-3}$ to $10^4$ torr during vaporization of the starting method.

18. The method according to claim 1, wherein the cooling is achieved by maintaining a temperature gradient in a reaction chamber, the starting material being vaporized in the reaction chamber and the vapor condensing to form filaments.

19. The method according to claim 1, wherein the intermetallic nanoparticles consist essentially of FeAl, $Fe_3Al$, NiAl, TiAl, Fe—Co—V or CuZn.

20. The method according to claim 1, wherein the vapor is formed in a reaction chamber containing a reactant gas selected from oxygen, nitrogen or hydrocarbon gases.

21. The method according to claim 1, wherein the vapor is formed in a reaction chamber maintained above atmospheric pressure.

* * * * *

UNITED STATES PATENT AND TRADEMARK OFFICE
CERTIFICATE OF CORRECTION

PATENT NO.    : 6,368,406 B1
DATED         : April 9, 2002
INVENTOR(S)   : Seetharama C. Deevi et al.

It is certified that error appears in the above-identified patent and that said Letters Patent is hereby corrected as shown below:

Column 3,
Line 8, delete "FIG. 1 a" and insert therefor -- FIG. 11*a* --;

Column 6,
Line 21, delete "$10^{-1}$ torr" and insert therefor -- $10^{-3}$ torr --;
Line 45, delete "gas ring" and insert therefor -- glass ring --;

Column 8,
Line 40, delete "6-9 mn" and insert therefor -- 6-9 nm --;

Column 9,
Line 50, delete "$FeAl_{204}$" and insert therefor -- $FeAl_2O_4$ --;

Column 12,
Line 11, delete "intermettalic nanoparticle have a a particle size" and insert therefor -- intermetallic nanoparticles have a particle size --;
Line 21, delete "claim 1" and insert therefor -- claim 6 --;
Line 34, delete "nanoparticles are comprise a metal carbide" and insert therefor -- nanoparticles comprise a metal carbide --; and
Line 35, delete "claim 6" and insert -- therefor -- claim 8 --.

Signed and Sealed this

Thirtieth Day of July, 2002

*Attest:*

*Attesting Officer*

JAMES E. ROGAN
*Director of the United States Patent and Trademark Office*